United States Patent
Miyanagi et al.

(10) Patent No.: US 8,367,510 B2
(45) Date of Patent: Feb. 5, 2013

(54) PROCESS FOR PRODUCING SILICON CARBIDE SEMICONDUCTOR DEVICE

(75) Inventors: Toshiyuki Miyanagi, Yokosuka (JP); Hidekazu Tsuchida, Yokosuka (JP); Isaho Kamata, Yokosuka (JP); Masahiro Nagano, Yokosuka (JP); Yoshitaka Sugawara, Osaka (JP); Koji Nakayama, Osaka (JP); Ryosuke Ishii, Osaka (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 852 days.

(21) Appl. No.: 12/067,028

(22) PCT Filed: Sep. 1, 2006

(86) PCT No.: PCT/JP2006/317339
§ 371 (c)(1),
(2), (4) Date: Aug. 5, 2009

(87) PCT Pub. No.: WO2007/032214
PCT Pub. Date: Mar. 22, 2007

(65) Prior Publication Data
US 2009/0317983 A1    Dec. 24, 2009

(30) Foreign Application Priority Data
Sep. 14, 2005 (JP) .................................. 2005-266884

(51) Int. Cl.
*H01L 21/331* (2006.01)
(52) U.S. Cl. ................................ 438/309; 257/E33.035
(58) Field of Classification Search .................. 438/309; 257/E33.035
See application file for complete search history.

(56) References Cited

U.S. PATENT DOCUMENTS 4,945,394 A * 7/1990 Palmour et al. .................. 257/77
5,323,022 A   6/1994 Glass et al.
(Continued)

FOREIGN PATENT DOCUMENTS

| EP | 1450394 A1 | 8/2004 |
| EP | 1494268 A2 | 1/2005 |

(Continued)

OTHER PUBLICATIONS

Jacobson et al., "Properties and Origins of Different Stacking Faults That Cause Degradation in SiC PiN Diodes", Journal of Applied Physics, vol. 95, No. 3, pp. 1485-1488, Feb. 1, 2004.

(Continued)

*Primary Examiner* — Thao P. Le
(74) *Attorney, Agent, or Firm* — The Webb Law Firm

(57) ABSTRACT

In a bipolar silicon carbide semiconductor device in which an electron and a hole recombine with each other during current passage within a silicon carbide epitaxial film grown from a surface of a silicon carbide single crystal substrate, an object described herein is the reduction of defects which are the nuclei of a stacking fault which is expanded by current passage, thereby suppressing the increase of the forward voltage of the bipolar silicon carbide semiconductor device. In a method for producing a bipolar silicon carbide semiconductor device, the device is subjected to a thermal treatment at a temperature of 300° C. or higher in the final step of production. Preferably, the above-mentioned thermal treatment is carried out after the formation of electrodes and then the resulting bipolar silicon carbide semiconductor device is mounted in a package.

10 Claims, 4 Drawing Sheets

U.S. PATENT DOCUMENTS

| | | | |
|---|---|---|---|
| 5,652,437 A | | 7/1997 | Harris |
| 6,025,233 A | * | 2/2000 | Terasawa .................. 438/270 |
| 6,121,633 A | * | 9/2000 | Singh et al. .................. 257/77 |
| 6,429,041 B1 | * | 8/2002 | Ryu et al. .................. 438/105 |
| 6,849,874 B2 | * | 2/2005 | Sumakeris et al. ............ 257/77 |
| 6,884,644 B1 | | 4/2005 | Slater, Jr. et al. |
| 7,378,325 B2 | | 5/2008 | Kaneko et al. |
| 7,528,040 B2 | * | 5/2009 | Das et al. .................. 438/268 |
| 7,811,874 B2 | * | 10/2010 | Harada et al. .............. 438/198 |
| 2002/0125482 A1 | | 9/2002 | Friedrichs et al. |
| 2003/0080842 A1 | * | 5/2003 | Sumakeris et al. ............ 336/77 |
| 2004/0159865 A1 | * | 8/2004 | Allen et al. .................. 257/280 |
| 2005/0285228 A1 | * | 12/2005 | Sugawara .................. 257/584 |
| 2006/0261876 A1 | * | 11/2006 | Agarwal et al. .............. 327/427 |
| 2009/0195296 A1 | * | 8/2009 | Miyanagi et al. ............ 327/530 |

FOREIGN PATENT DOCUMENTS

| | | |
|---|---|---|
| JP | 2002175997 | 6/2002 |
| JP | 2004022878 | 1/2004 |
| JP | 2004063860 | 2/2004 |
| JP | 2004247545 | 9/2004 |
| JP | 2004289023 | 10/2004 |
| WO | 03038876 | 5/2003 |

OTHER PUBLICATIONS

Ha et al., "Dislocation Nucleation in 4H Silicon Carbide Epitaxy", Journal of Crystal Growth, vol. 262, pp. 130-138, 2004.

Skowronski et al., "Recombination-Enhanced Defect Motion in Forward-Biased 4H-SiC p-n Diodes", Journal of Applied Physics, vol. 92, No. 8, pp. 4699-4704, Oct. 15, 2002.

* cited by examiner (a)

(b)

No thermal treatment (Comparative Example 1)

Thermal treatment temperature 200°C (Comparative Example 2)

Thermal treatment temperature 300°C (Example 1)

Thermal treatment temperature 400°C (Example 2)

Thermal treatment temperature 500°C (Example 3)

Thermal treatment temperature 600°C (Example 4)

US 8,367,510 B2

PROCESS FOR PRODUCING SILICON CARBIDE SEMICONDUCTOR DEVICE

TECHNICAL FIELD

The present invention relates to a method for producing a silicon carbide semiconductor device, especially a bipolar silicon carbide semiconductor device in which an electron and a hole recombine with each other during current passage within a silicon carbide epitaxial film grown from a surface of a silicon carbide single crystal substrate. In particular, the present invention relates to a technical improvement for reduction of defects which are the nuclei of a stacking fault causing an increase of a forward voltage during current passage with time.

BACKGROUND ART

Silicon carbide (SiC) has a dielectric breakdown field strength about ten times as large as that of silicon (Si), and in addition to that, is a semiconductor having excellent physical properties also in thermal conductivity, electron mobility, band gap and the like. Therefore, it is expected as a semiconductor material which can achieve dramatic improvement of performance compared with a conventional silicon-based power semiconductor device.

In recent years, development of a high performance silicon carbide semiconductor device has been advanced: for example, a 4H-silicon carbide single crystal substrate and a 6H-silicon carbide single crystal substrate having a diameter up to 3 inches have become commercially available, and there have been successively reported various semiconductor switching devices which substantially exceed the performance limits of Si.

A semiconductor device is classified roughly into a unipolar semiconductor device, in which only an electron or a hole acts on electric conduction during current passage, or a bipolar semiconductor device, in which both an electron and a hole act on electric conduction. The unipolar semiconductor devices include a Schottky barrier diode (SBD), a junction field effect transistor (J-FET), and a metal/oxide/semiconductor field effect transistor (MOS-FET). The bipolar semiconductor devices include a pn diode, a bipolar junction transistor (BJT), a thyristor, a gate turn-off thyristor (GTO thyristor), and an insulated gate bipolar transistor (IGBT).

When a power semiconductor device is produced using a silicon carbide single crystal, since impurities are difficult to be deeply diffused because of the extremely small diffusion coefficient of the silicon carbide single crystal, a single crystal film having the same crystal type as the substrate and having a predetermined film thickness and doping concentration is frequently epitaxially grown on the silicon carbide bulk single crystal substrate (Patent Document 1). Specifically, a silicon carbide single crystal substrate is used in which an epitaxial single crystal film is grown by a CVD method on a surface of a substrate that is a slice of a bulk single crystal obtained by a sublimation method or chemical vapor deposition (CVD) method.

There are various crystal polymorphs (polytypes) of silicon carbide single crystal. In the development of the power semiconductor device, there is mainly used a 4H-silicon carbide which has a high dielectric breakdown field strength, high mobility and a relatively small anisotropy. The crystal faces subjected to epitaxial growth include a (0001) Si face, (000-1) C face, (11-20) face, (01-10) face, and (03-38) face. When the single crystal film is grown epitaxially from the (0001) Si face and (000-1) C face, a crystal face in which these faces are inclined by a few degrees of angle towards the direction of [11-20] or [01-10] is frequently used in order to grow the crystal homo-epitaxially with the step flow growth technology.

[Patent Document 1]
International Publication No. WO03/038876 Pamphlet
[Non-patent Document 1]
Journal of Applied Physics, Vol. 95, No. 3, pp. 1485-1488, 2004.
[Non-patent Document 2]
Journal of Applied Physics, Vol. 92, No. 8, pp. 4699-4704, 2002.
[Non-patent Document 3]
Journal of Crystal Growth, Vol. 262, pp. 130-138, 2004.

Although the power semiconductor device using silicon carbide has various excellent properties as mentioned above, there have been the following problems. Various crystal defects are generated in the production process within the silicon carbide single crystal in the bipolar silicon carbide semiconductor device. Specifically, in the first place, various crystal defects are generated in the step of growing silicon carbide bulk single crystal by using a modified Rayleigh method or a CVD method. In a bipolar silicon carbide semiconductor device produced by using a wafer which is cut out from a silicon carbide bulk single crystal containing these various crystal defects, the crystal defects present within the wafer cause the deterioration of device properties.

In the second place, various crystal defects are generated in a silicon carbide epitaxial film in the step of growing it from a surface of a silicon carbide bulk single crystal substrate by a CVD method. The crystal defects generated here include various kinds such as a line defect, a point defect, and a ring defect.

FIGS. 1 (a) and (b) are cross-sectional views showing the vicinity of the interface between a silicon carbide single crystal substrate and a silicon carbide epitaxial film formed on the surface of the substrate with the step flow growth technology. In FIG. 1 (a), 5 is a crystal face ((0001) Si face) and θ is an off-angle. As shown in FIG. 1 (a), there exist various crystal defects including a line defect 6, a point defect 7, and a ring defect 8 in epitaxial films (n type epitaxial film 2a and p type epitaxial film (or a p type implanted layer) 2b) formed on a silicon carbide single crystal substrate 1. The line defects 6 include, for example, a basal plane dislocation extending in parallel with the (0001) Si face. In addition, as shown in FIG. 1 (b), there exist many ring defects 8 in the vicinity of the surface of the silicon carbide epitaxial film 2.

In a bipolar device such as a pn diode, an n type epitaxial film, and a vicinity of the interface between the n type epitaxial film and a p type epitaxial film or a vicinity of the interface between the n type epitaxial film and a p type implanted layer are regions in which an electron and a hole recombine with each other during current passage. However, defects which are Shockley partial dislocations (also referred to as a Shockley imperfect partial dislocations) having a Burgers vector of [01-10] cause a stacking fault by being affected by the recombination energy of an electron and a hole generated during current passage (the above-mentioned Non-patent Documents 1 to 4). As shown in FIG. 4, the stacking fault appears as a planar defect having a shape of a triangle, rhombus and the like.

The region of the stacking fault is considered to act as a high resistance area during current passage. As a result, a forward voltage of a bipolar semiconductor device is increased as the area of the stacking fault expands.

In the third place, after a silicon carbide epitaxial film is formed on a surface of a silicon carbide bulk single crystal substrate, a bipolar silicon carbide semiconductor device is produced through various steps such as, for example, formation of a mesa structure, ion implantation, formation of an oxide film, and formation of an electrode. However, the above-mentioned crystal defects, that is, the line defect, the point defect, the ring defect and the like are generated even in these device processing steps onto the silicon carbide single crystal. For example, since the diffusion coefficient for the impurity atoms is small in the silicon carbide bulk single crystal and therefore the doping of impurities by a thermal diffusion method is difficult to apply to the silicon carbide bulk single crystal substrate, a nitrogen ion or an aluminum ion may be introduced into the silicon carbide epitaxial film by ion implantation. In addition, even in the forming of JTE in a pn diode, ions are implanted into the silicon carbide epitaxial film. In implanting these ions, impurity ions implanted into the crystal collide with the crystal, thereby breaking the crystal structure of the silicon carbide single crystal and damaging the silicon carbide single crystal. As a result, the above-mentioned crystal defect is expected to be generated.

As mentioned above, various crystal defects are generated within a silicon carbide single crystal in the step of forming a silicon carbide single crystal substrate, in the step of forming a silicon carbide epitaxial film and in the subsequent step of device processing a silicon carbide crystal. The crystal defects cause the deterioration of properties of the bipolar silicon carbide semiconductor device produced. Especially, the crystal defects present in the silicon carbide epitaxial film are transformed into planes by current passage to cause a stacking fault, and if the area of such fault is expanded the forward voltage is increased. The increase of the forward voltage decreases the reliability of the silicon carbide bipolar semiconductor device and causes the increase of power loss of power control equipment incorporated with the bipolar silicon carbide semiconductor device. For this reason, there has been a need that the defects should be reduced which are the nuclei of a stacking fault which is expanded by current passage.

The present invention is made for solving the above-mentioned problems in the conventional technology and it is an object of the present invention to reduce the defects which are the nuclei of a stacking fault which is expanded by current passage, thereby preventing the increase of a forward voltage of a bipolar silicon carbide semiconductor device.

SUMMARY OF THE INVENTION

When a bipolar silicon carbide semiconductor device was heat treated in advance at a temperature of 300° C. or higher, the formation of a stacking fault caused by current passage was substantially suppressed. Based on this finding, the inventors have found that the increase of a forward voltage during the current passage is suppressed by heating the bipolar silicon carbide semiconductor device at a temperature of 300° C. or higher in the final production step of the bipolar silicon carbide semiconductor device, and thus have completed the present invention.

A method for producing a bipolar silicon carbide semiconductor device of the present invention is a method for producing a bipolar silicon carbide semiconductor device in which an electron and a hole recombine with each other during current passage within a silicon carbide epitaxial film grown from a surface of a silicon carbide single crystal substrate, comprising heating the bipolar silicon carbide semiconductor device at a temperature of 300° C. or higher in the final step in the production of the bipolar silicon carbide semiconductor device.

The step of heating the bipolar silicon carbide semiconductor device at a temperature of 300° C. or higher is typically carried out after a step of forming an electrode. In addition, the step is carried out at least after all the ion implantation steps and is carried out at least after a step in which an oxide film at regions including regions where electrodes will be formed, is removed from the surface of the device on which the oxide film is formed in order to protect the device surface, and thereby the epitaxial film in such regions is exposed.

The above-mentioned invention is preferably applied to the production of a bipolar silicon carbide semiconductor device mounted in a package which has a limited heat-resistance temperature. In this case, the production of the bipolar silicon carbide semiconductor device is completed by the step of heating the bipolar silicon carbide semiconductor device at a temperature of 300° C. or higher and thereafter the resulting bipolar silicon carbide semiconductor device is mounted in the package.

The above-mentioned invention is preferably applied in the case where the silicon carbide single crystal substrate is a hexagonal silicon carbide single crystal substrate and the silicon carbide epitaxial film is a hexagonal silicon carbide epitaxial film, more specifically, in the case where both of the hexagonal silicon carbide single crystal substrate and the hexagonal silicon carbide epitaxial film have a four-fold periodicity, a six-fold periodicity or a two-fold periodicity. Alternatively, the above-mentioned invention is preferably applied in the case where the silicon carbide single crystal substrate is a silicon carbide single crystal substrate of rhombohedral fifteen-fold periodicity form and the silicon carbide epitaxial film is a silicon carbide epitaxial film of rhombohedral fifteen-fold periodicity form.

In addition, the method for producing a bipolar silicon carbide semiconductor device of the present invention further comprises irradiating an operation region of the bipolar silicon carbide semiconductor device with light having a wavelength at which an electron-hole pair may be generated before heating the bipolar silicon carbide semiconductor device at a temperature of 300° C. or higher.

A stacking fault may be more effectively reduced by performing the light irradiation before the thermal treatment in this way.

Furthermore, a method for producing a silicon carbide semiconductor device of the present invention, comprises, a step of applying light having a wavelength at which an electron-hole pair may be generated, wherein when the silicon carbide semiconductor device is in the course of production, the light is applied to a region of the silicon carbide semiconductor that will be an operation region of the device, and when the formation of the device is completed, the light is applied to the operation region of the device; and a step of heating the silicon carbide semiconductor or the silicon carbide semiconductor device at a temperature of 300° C. or higher.

Here, "the formation of the device is completed" means that all device formation steps are completed except for the above-mentioned light irradiation and thermal treatment.

According to the above-mentioned invention, a stacking fault may be effectively reduced. This provides improved reliability of a silicon carbide semiconductor device.

The present invention may reduce defects which are the nuclei of a stacking fault which is expanded by current passage, thereby preventing the increase of a forward voltage of a bipolar silicon carbide semiconductor device.

BEST MODE FOR CARRYING OUT THE INVENTION

Figure 1:
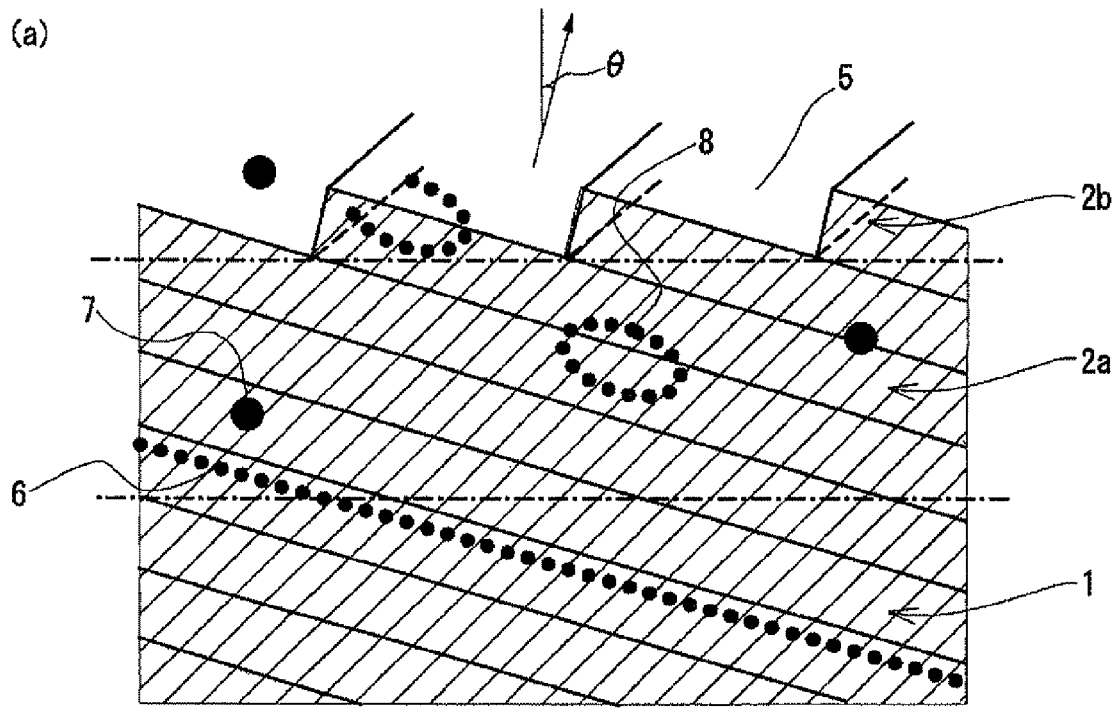
FIGS. 1 (*a*) and (*b*) are a set of cross-sectional views showing a vicinity of the interface between a silicon carbide single crystal substrate and a silicon carbide epitaxial film formed on the surface of the substrate with the step flow growth technology.
Figure 1:
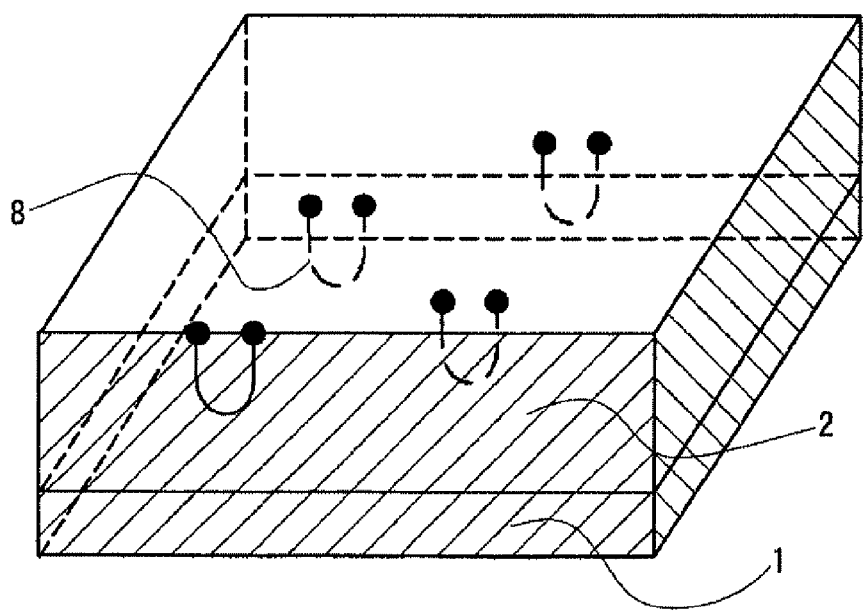

Hereinafter, the present invention will be described with reference to the drawings. Here, the lattice direction and the lattice plane are represented by [ ] and ( ), respectively. Although crystallographically "-" (a bar) shall be placed above the digit for a negative exponent, a minus sign is placed in front of the digit for convenience of preparing specification.

In the present invention, a bipolar silicon carbide semiconductor device is produced in a conventional manner until before the final step. As a semiconductor substrate on which an electrode and the like are formed, there is used a silicon carbide single crystal substrate from the surface of which a silicon carbide epitaxial single crystal film is grown.

As the silicon carbide single crystal substrate, there is used one which is obtained by slicing a bulk crystal obtained by a sublimation method or chemical vapor deposition method. In the case of using a sublimation method (modified Lely method), for example, a silicon carbide powder placed in a crucible is heated at 2200 to 2400° C. to evaporate and then is deposited on the surface of the seed crystal to bulk grow at a speed of typically 0.8 to 1 mm/h. The resulting ingot is sliced to a predetermined thickness to expose a desired crystal face. In order to suppress the propagation of the basal plane dislocation to the epitaxial film, the surface of the cut-out wafer is preferably polished to a mirror state by treatments such as grinding treatment using abrasive grains for grinding, hydrogen etching and chemical mechanical polishing (CMP).

A silicon carbide single crystal epitaxial film is grown from a surface of the silicon carbide single crystal substrate. There are various crystal polymorphs (polytypes) of silicon carbide single crystal, and there are used, for example, 4H—SiC, 6H—SiC, 2H—SiC, 15R—SiC and the like as the silicon carbide single crystal substrate. Among them, 4H—SiC has a high dielectric breakdown field strength and mobility and a relatively small anisotropy. The crystal faces for performing epitaxial growth may include, for example, a (0001) Si face, (000-1) C face, (11-20) face, (01-10) face, and (03-38) face.

In the case where the epitaxial growth is carried out on the (0001) Si face and (000-1) C face, a substrate for use is one that is cut out, for example, with inclination at an off-angle of 1 to 12' to the [01-10] direction, the [11-20] direction or the off-direction of the middle direction between the [01-10] direction and [11-20] direction; and silicon carbide is subjected to epitaxial growth from the crystal face with the step flow growth technology.

The epitaxial growth of the silicon carbide single crystal film is carried out by a CVD method. Propane and the like are used as the source material gas of C, and silane and the like are used as the source material gas of Si. A mixed gas including these source material gases, a carrier gas such as hydrogen and a dopant gas is supplied to the surface of the silicon carbide single crystal substrate. As the dopant gas, nitrogen and the like are used in the case of growing an n type epitaxial film whereas trimethylaluminum and the like are used in the case of growing a p type epitaxial film.

Silicon carbide is subjected to epitaxial growth at a typical growth speed of 2 to 20 μm/h, under these gas atmospheres, and for example, under conditions of 1500 to 1600° C. and 40 to 80 Torr. Thus, silicon carbide of the same crystal type as the silicon carbide single crystal substrate undergoes the step-flow growth.

A vertical hot wall furnace may be used as the specific apparatus for performing epitaxial growth. A water-cooled double cylindrical tube made of quartz is attached to the vertical hot wall furnace. There are installed a cylindrical heat insulating material, a hot wall made of graphite and a wedge type suscepter for holding the silicon carbide single crystal substrate in a vertical direction inside the water-cooled double cylindrical tube. A high frequency heating coil is installed at the external periphery of the water-cooled double cylindrical tube. The hot wall is heated by high frequency induction with the high frequency heating coil and the silicon carbide single crystal substrate held by the wedge type suscepter is heated by radiant heat from the hot wall. Silicon carbide is subjected to epitaxial growth on the surface of the silicon carbide single crystal substrate by supplying the reaction gas from the lower section of the water-cooled double cylindrical tube while heating the silicon carbide single crystal substrate.

A bipolar device is fabricated by using the silicon carbide single crystal substrate on which an epitaxial film is formed in this way. Hereinafter, an example of a production method of a pn (pin) diode, which is one of bipolar devices, is described with reference to FIG. 2. A silicon carbide single crystal substrate 21 is composed of an n type 4H-silicon carbide single crystal (carrier density: $8 \times 10^{18}$ cm$^{-3}$, thickness: 400 μm) which is obtained by slicing an ingot grown by a modified Lely method at a predetermined off-angle and by mirror-treating the surface. On the single crystal substrate, a nitrogen doped n type silicon carbide layer (drift layer 23, donor density: $5 \times 10^{14}$ cm$^{-3}$, thickness: 40 μm) and aluminum doped p type silicon carbide layers (p type junction layer 24, acceptor density: $5 \times 10^{17}$ cm$^{-3}$, thickness: 1.5 μm; and p+ type contact layer 25, acceptor density: $1 \times 10^{18}$ cm$^{-3}$, thickness: 0.5 μm) are epitaxially grown successively by a CVD method.

Next, the peripheral section of the epitaxial film is removed by reactive ion etching (RIE) to form a mesa structure. In order to form the mesa structure, a Ni metal film is deposited on the epitaxial film. An electron-beam heating-deposition apparatus is used for deposition. The electron-beam heating-deposition apparatus is equipped with an electron beam generator, a crucible for accommodating a piece of Ni metal and a substrate holder for holding the silicon carbide single crystal substrate with the surface of the epitaxial film facing outside. The piece of Ni metal placed in the crucible is melted by applying an electron beam accelerated at approximately 10 kV and then is deposited on the epitaxial film.

A photoresist for patterning the mesa structure is applied on the surface of the Ni metal film deposited on the epitaxial film using a spin coater so that the thickness of the photoresist is 1 μm and then the resist film is heat treated in an oven. The resist film is exposed to ultraviolet light through a mask corresponding to the pattern of the mesa structure and is developed by using a resist developing solution. The Ni metal film exposed on the surface of the substrate by the development is removed with an acid, and then the epitaxial film exposed on the surface of the substrate by removing the Ni metal film is etched by RIE using a mixed gas of carbon tetrafluoride and oxygen to form a mesa 4 µm in height and weight.

Next, aluminum ions are implanted to form a JTE (junction termination extension) 26 in order to relax an electric field concentration at the mesa bottom. The JTE 26 has a total dose of $1.2 \times 10^{13}$ cm$^{-2}$, a width of 250 µm and a depth of 0.7 µm. By implanting the ions while energy is sequentially changed between 30 and 450 keV the implanted aluminum ions have a concentration distribution such that a concentration in the direction of the depth is constant. After the ions are implanted, the aluminum ions are activated by performing a thermal treatment under an argon gas atmosphere.

Thereafter, an oxide film 27 for protecting the device surface is formed. The substrate is placed in a thermal oxidizing furnace to carry out thermal oxidation and the substrate is heated while supplying a dried oxygen gas to form a thermally oxidized film having a thickness of 40 nm on the whole surface of the substrate. Then, a pattern is formed by photolithography technology so as to expose predetermined regions on the surface of the substrate such as a region where an electrode will be formed, and the thermally oxidized film in these regions is removed with hydrofluoric acid to expose the epitaxial film.

Next, a cathode electrode 28 and an anode electrode 29 are deposited using an electron-beam heating-de position apparatus. The cathode electrode 28 is formed by depositing Ni (to a thickness of 350 nm) on the under surface of the substrate 21. The anode electrode 29 is formed by depositing a film of Ti (to a thickness of 100 nm) and a film of Al (to a thickness of 350 nm) in turn on the upper surface of the p+ type contact layer 25. These electrodes are formed into an ohmic electrode by a thermal treatment after the deposition to form an alloy with silicon carbide.

In the present invention, a bipolar silicon carbide semiconductor device is heated at a temperature of 300° C. or higher, preferably of 300 to 600° C. and more preferably of 400 to 500° C. If the temperature exceeds 600° C., the bipolar silicon carbide semiconductor device may not run normally because the electrodes may be molten depending on the metal material.

The defects which are the nuclei of a stacking fault may be reduced and an increase of a forward voltage due to current passage may be suppressed by heating the bipolar silicon carbide semiconductor device produced by the above-mentioned method at the above-mentioned temperature range. In other words, as shown also in Examples described later, the defects which are the nuclei of a stacking fault may be reduced and an increase of a forward voltage may be suppressed by heating at a boundary in the vicinity of 300° C.

This phenomenon is thought to be caused by the following reasons. As mentioned above, in a bipolar semiconductor device such as a pn diode, an n type epitaxial film, and a vicinity of the interface between a p type epitaxial film and a p type epitaxial film, or a vicinity of the interface between the n type epitaxial film and a p type implanted layer are regions in which an electron and a hole recombine with each other during current passage. The defects present in the silicon carbide epitaxial film cause a stacking fault by being affected by this recombination energy. The region in which the stacking fault is formed is thought to act as a high resistance region during current passage. As a result, a forward voltage of a bipolar silicon carbide semiconductor device is increased as an area of the stacking fault expands.

However, if the thermal treatment is carried out at a temperature of 300° C. or higher, defects are reduced because Si atoms and C atoms forming the defects which are the nuclei of a stacking fault become more stable when they exist at a normal lattice position than when they exist as defects. This is thought to be a reason as to why an increase of a forward voltage due to current passage is suppressed. In addition, a stacking fault caused by expansion of the nucleus defects may be inspected by observing the bipolar silicon carbide semiconductor device after current passage using an X-ray topographic image, a photoluminescence image, an electroluminescence image, a cathode luminescence image, an etch pit by molten-salt etching and the like. In addition, the nucleus defects which can develop into a stacking fault may also be inspected by the above-mentioned means.

The above-mentioned thermal treatment is carried out under an inert gas atmosphere such as argon gas until the nucleus defects which can develop into a stacking fault are sufficiently reduced. The thermal treatment is carried out as the final step in the device production process, and is typically carried out after the step of forming electrodes. This thermal treatment is carried out at least after all the ion implantation steps, and is carried out at least after the step in which the oxide film at regions including regions where the electrodes will be formed, is removed from the surface of the device on which the oxide film is formed in order to protect the device surface, and thereby the epitaxial film in such regions is exposed.

In addition, as a part of the electrode forming step, thermal treatment may be carried out at a predetermined temperature after the electrode deposition for the purpose of sintering in the interface between the metal that forms the electrode and SiC. However, a sufficient thermal treatment is required to be carried out as a step separate from this step in order to sufficiently reduce the nucleus defects which can develop into a stacking fault as mentioned above. The time of the thermal treatment at a temperature of 300° C. or higher in the present invention varies depending on the heating temperature and defect density. If the heating temperature is low in the above-mentioned range of the heating temperature or if the defect density is high, the heating time is preferably prolonged. The time of the heat treatment is typically 10 minutes or longer, preferably 10 to 120 minutes and more preferably 30 to 60 minutes.

A bipolar silicon carbide semiconductor device obtained by performing the above-mentioned thermal treatment is frequently mounted in a package. Such a device is incorporated into an instrument and an apparatus for power control in a form where it is mounted in a package. Such a package typically has a minimum heat resistant temperature of approximately 200° C. from a viewpoint of heat-resistance and the like of a resin material used for adhesion and sealing of the device with an insulating substrate. Accordingly, the above-mentioned thermal treatment is required to be carried out before mounting the device in the package.

Figure 4:
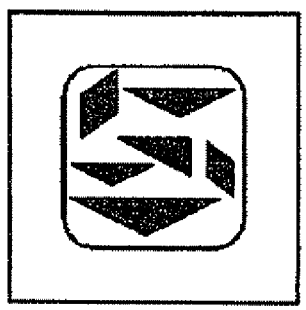
FIG. 4 is a collection of schematic views showing the results obtained by performing a current passage test for each pn diode subjected to a thermal treatment at each temperature up to 600° C. and observing the photoluminescent image of a silicon carbide epitaxial film in the pn diode after the testing.
Figure 4:
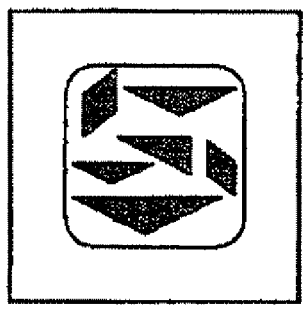
Figure 4:
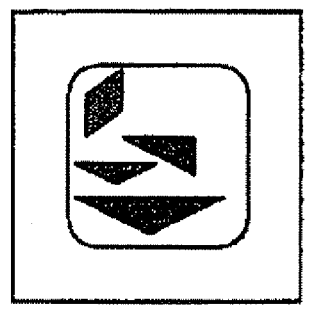
Figure 4:
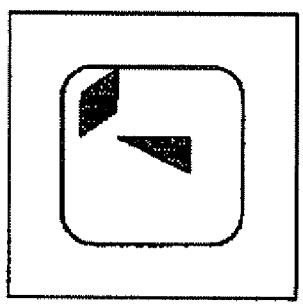
Figure 4:
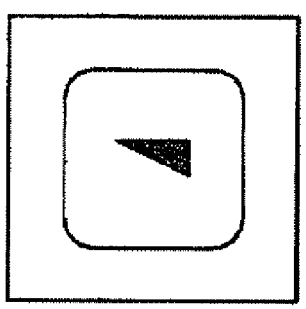
Figure 4:
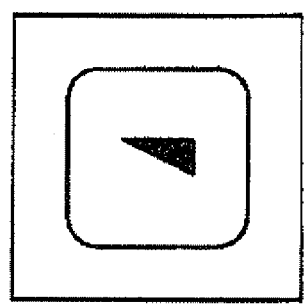

As shown in Examples described later, a plurality of pn diodes were fabricated using silicon carbide of which the crystal type was 4H, and current was passed to each of the pn diodes with thermal treatment at each temperature and pn diodes without thermal treatment, at a current density of 100 A/cm$^2$ for 60 minutes. Then, it was confirmed that the pn diodes without thermal treatment had many stacking faults as shown in FIG. 4. It was also confirmed that pn diodes which had been heated at a temperature of less than 300° C. had a stacking fault which was nearly equal to that of the pn diodes without thermal treatment. However, when the thermal treatment was carried out at 300° C., a reduction of the stacking faults began to be found. As the heating temperature was increased, the stacking faults were considerably decreased, and in the case of heating at 500° C., almost no stacking faults were observed. In addition, when the thermal treatment was carried out at 600° C., no further reduction was observed.

In this way, an increase of a forward voltage of a bipolar silicon carbide semiconductor device after current passage may be suppressed by heating at a temperature of 300° C. or higher. This phenomenon is presumed not to depend on a crystal face where the epitaxial growth is carried out. For example, the same phenomenon are generated even when a (0001) Si face, (000-1) C face, (11-20) face, (01-10) face, (03-38) face and the like are used as a crystal face where the epitaxial growth is carried out. In particular, if an angle formed by the face of stacking fault and the direction of the current passage path is large, for example, if the face of a stacking fault perpendicularly intercepts the current passage path, the stacking fault significantly influences the deterioration of the current passage. Even in this case, an increase of the forward voltage may be suppressed.

On the other hand, silicon carbide single crystal has a plurality of crystal types. The above-mentioned phenomenon is presumed to be due to stabilization of the silicon carbide bulk single crystal at a temperature of 300° C. or higher. From this point, even when there are used 6H—SiC (hexagonal six-fold periodicity form), 2H—SiC (hexagonal two-fold periodicity form), and 15R—SiC (rhombohedral fifteen-fold periodicity form) in addition to 4H—SiC (hexagonal four-fold periodicity form), defects which are the nuclei of a stacking fault are similarly reduced by the above-mentioned thermal treatment. As a result, an increase of a forward voltage due to current passage is suppressed.

As long as semiconductor devices are bipolar silicon carbide semiconductor devices in which an electron and a hole recombine with each other during current passage within a silicon carbide epitaxial film grown from a surface of a silicon carbide single crystal substrate, bipolar silicon carbide semiconductor devices other than pn diodes may benefit from the stabilization of the silicon carbide epitaxial film by the thermal treatment at the above temperature. As a result, defects which are the nuclei of a stacking fault are reduced, and an increase of a forward voltage due to current passage is suppressed. Such bipolar silicon carbide semiconductor devices include, for example, a thyrister, a gate turn-off thyrister (GTO thyrister), an insulated gate bipolar transistor (IGBT) and a bipolar junction transistor (BJT).

The present invention is based on the finding that defects may be removed by heating at an extremely lower temperature than the sublimation temperature (2000 to 2200° C.) of silicon carbide. With a silicon semiconductor device, thermal treatment may be carried out for the purpose of removing defects, however, the thermal treatment is carried out at 1200° C. which is near the melting point (1400° C.) of silicon. Such temperature range is entirely different from that of the present invention.

Hereinafter, another embodiment in the present invention will be mentioned. In this embodiment, before the thermal treatment at a temperature of 300° C. or higher, a light irradiation at a wavelength at which an electron-hole pair may be generated is carried out to the SiC single crystal that is an operation region of a semiconductor device.

This light irradiation may provide a further enhancement of the reduction effect of a stacking fault. This effect is due to the fact that the generation of an electron-hole pair within the SiC single crystal causes a change of a stacking fault of perfect dislocation loop type into that of partial dislocation loop type which can be reduced by heating more easily.

Figure 3:
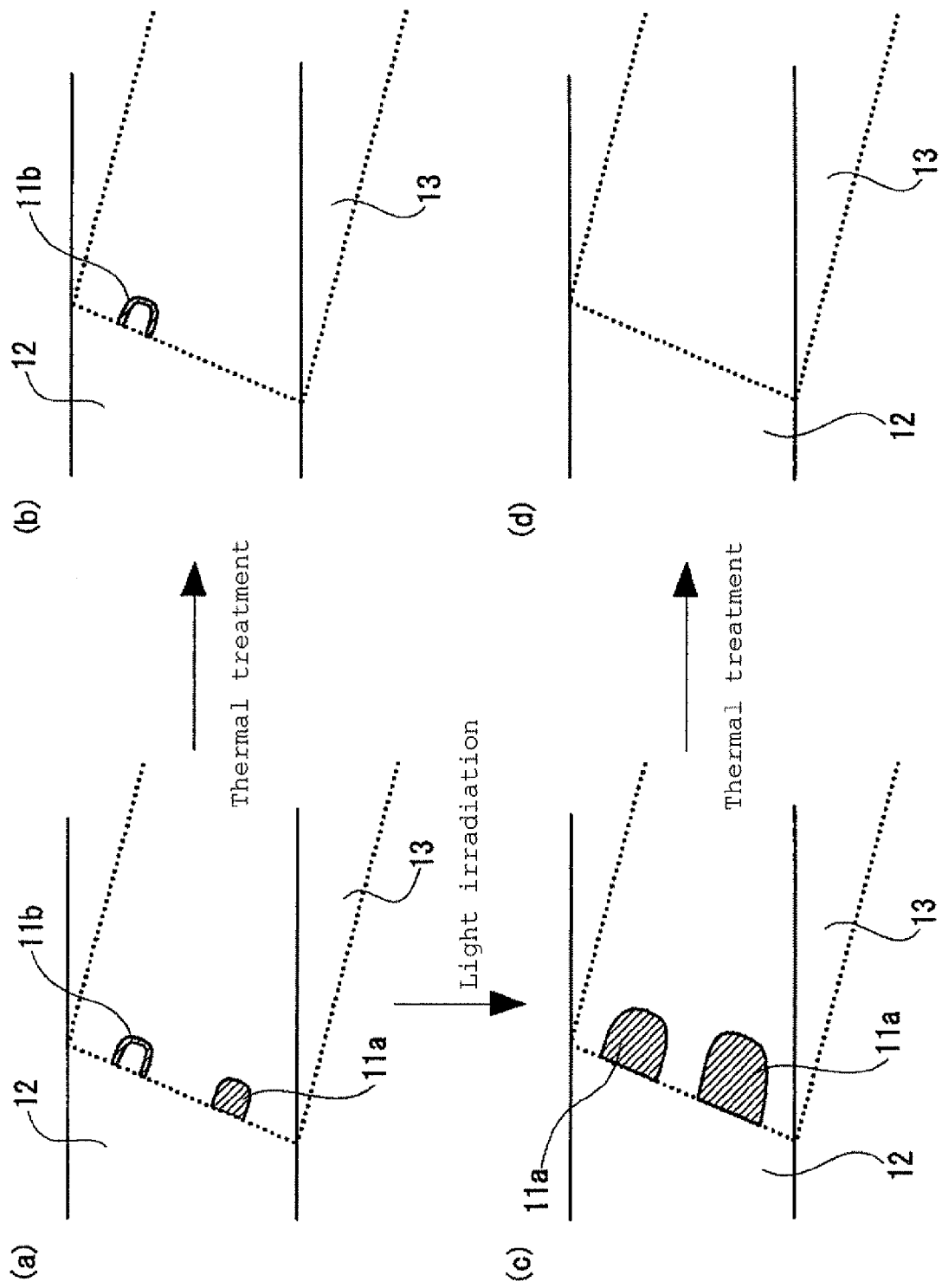
FIGS. 3(a)-(d) are a series of diagrams illustrating an embodiment in which a light irradiation is carried out to an operation region of a device before thermal treatment.

Hereinafter, the embodiment will be described with reference to FIG. 3. In the figure, the symbol 12 represents a surface of a SiC epitaxial film and the symbol 13 represents a (0001) Si face. As shown in FIG. 3(a), there exist two kinds of the stacking faults within the SiC single crystal: stacking faults 11a composed of partial dislocation loops and stacking faults 11b composed of perfect dislocation loops.

When the above-mentioned thermal treatment is carried out to the SiC single crystal, as shown in FIG. 3(b), the stacking faults 11a composed of partial dislocation loops disappear whereas the stacking faults 11b composed of perfect dislocation loops do not disappear. The reason is that in the perfect dislocation loop, the perfect dislocation is dissociated into two partial dislocations that repel each other, and consequently the stacking fault present between the two partial dislocations cannot be eliminated. In contrast, because the partial dislocation loop is composed of only one partial dislocation, no repulsion are generated and the stacking fault disappears.

On the other hand, as shown in FIG. 3(c), when light with a wavelength at which an electron-hole pair may be generated is applied before the thermal treatment, the irradiation enlarges the stacking faults, and the stacking faults 11b composed of perfect dislocation loops are changed into the stacking faults 11a composed of partial dislocation loops. By performing the above-mentioned thermal treatment thereafter, both the stacking faults 11a and the stacking faults 11b in FIG. 3(a) disappear, as shown in FIG. 3(d).

The light irradiation is carried out at a wavelength and intensity in which an electron-hole pair may be generated in an operation region of a device. For example, there may be used a laser light or LED light having a wavelength of 350 to 365 nm.

As mentioned above, the light irradiation step and the thermal treatment step in the embodiment may be carried out at the end of the production process of a bipolar silicon carbide semiconductor device. In other words, the light irradiation at a wavelength at which an electron-hole pair may be generated is carried out to the operation region of the bipolar silicon carbide semiconductor device, and then the bipolar silicon carbide semiconductor device is heated at a temperature of 300° C. or higher.

Further, the light irradiation step and the thermal treatment step in the embodiment may be widely applied in the production process of a silicon carbide semiconductor device. In other words, the light irradiation at a wavelength at which an electron-hole pair may be generated may be carried out to an operation region of a silicon carbide semiconductor device while or after the device is formed; and the silicon carbide semiconductor or the silicon carbide semiconductor device is then heated at a temperature of 300° C. or higher, thereby effectively preventing stacking faults.

As above, embodiments of the present invention are described. However, the present invention is not limited by the above-mentioned embodiments, and various modifications and alterations can be made within the scope not departing from the gist of the present invention.

EXAMPLES

Hereinafter, the present invention will be described by Examples, but the present invention is not limited by these Examples.

Example 1

Figure 2:
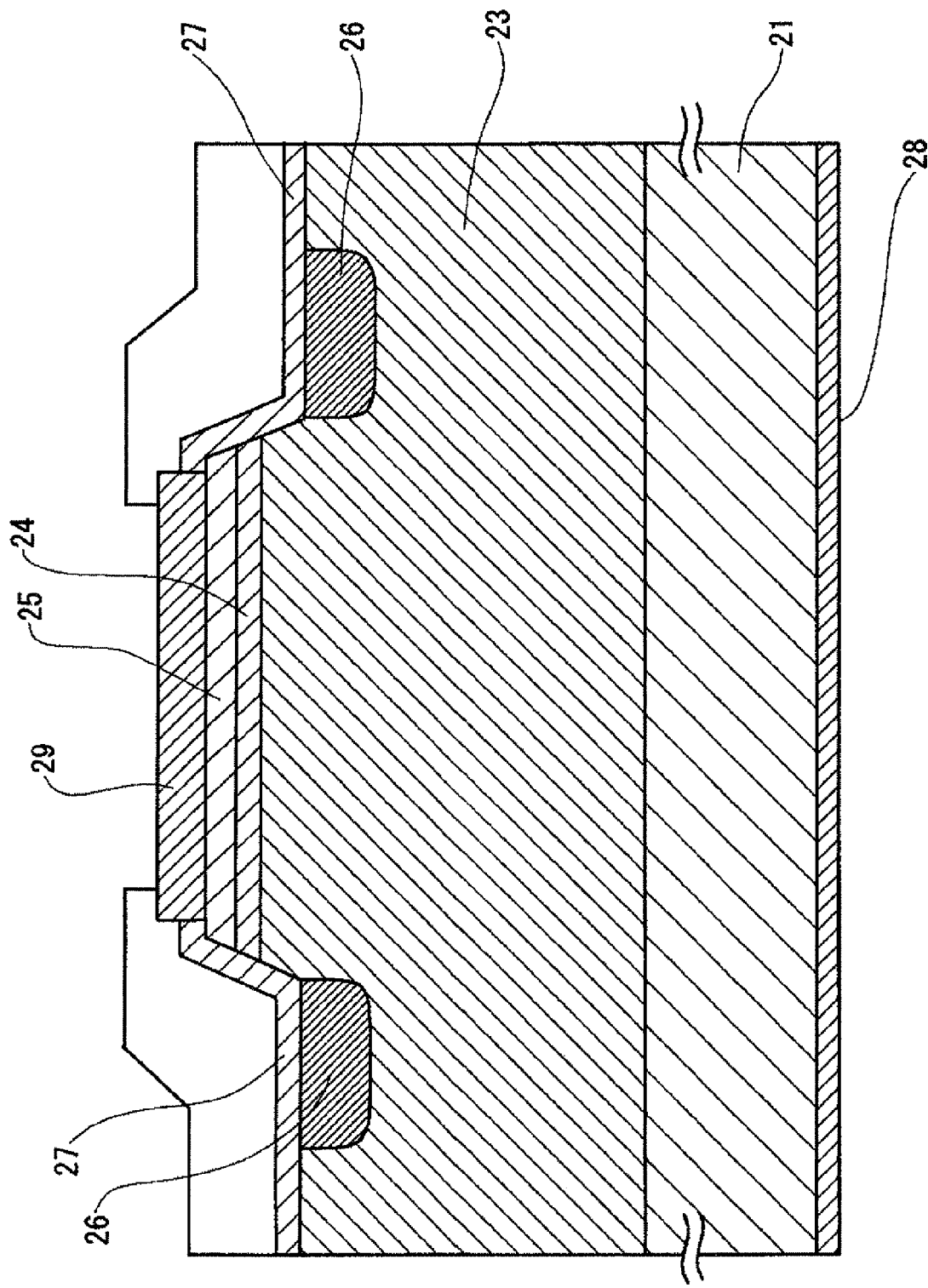
FIG. 2 is a cross-sectional view of a pn diode produced using a silicon carbide single crystal substrate on the surface of which an epitaxial film is formed.

A pn diode shown in FIG. 2 was fabricated for testing. An n type 4H-silicon carbide (0001) substrate (carrier density: $8 \times 10^{18}$ cm$^{-3}$, thickness: 400 μm) was obtained by slicing an ingot grown by a modified Lely method in the off direction [11-20] and at an off-angle of 8°, and by mirror-treating the surface. On the substrate, a nitrogen doped n type silicon carbide layer (donor density: $5\times10^{14}$ cm$^{-3}$, thickness: 40 μm) and aluminum doped p type silicon carbide layers (p type junction layer, acceptor density: $5\times10^{17}$ cm$^{-3}$, thickness: 1.5 μm; and p+ type contact layer, acceptor density: $1\times10^{18}$ cm$^{-3}$, thickness: 0.5 μm) were epitaxially grown successively by a CVD method.

Next, the peripheral portion of the epitaxial film was removed by reactive ion etching (RIE) to form a mesa structure 4 μm in height and width. In order to relax the electric field concentration at the mesa bottom, aluminum ions were implanted into the mesa bottom to form JTE having a total dose of $1.2\times10^{13}$ cm$^{-3}$, a width of 250 μm and a depth of 0.7 μm. After the ions were implanted, the aluminum ions were activated by carrying out a thermal treatment under an argon gas atmosphere. Thereafter, a thermally oxidized film for protection was formed on the device surface.

Next, a cathode electrode and an anode electrode were deposited on both sides of the resulting substrate using an electron-beam heating-deposition apparatus. The cathode electrode was formed by depositing Ni (to a thickness of 350 μm) on the under surface of the substrate. The anode electrode was formed by depositing a film of Ti (to a thickness of 100 μm) and a film of Al (to a thickness of 350 μm) in turn on the upper surface of the p+ type contact layer. After the electrodes were deposited, they were caused to form an alloy with the silicon carbide to produce ohmic electrodes.

The pn diode thus obtained was subjected to a thermal treatment at 300° C. for 60 minutes under an inert gas atmosphere and then the following current passage test was carried out. The cathode electrode of the pn diode was bonded on a copper plate using a high melting solder and an aluminum wire was bonded to the anode electrode using ultrasonic bonding equipment. A current source and a voltmeter were connected to the copper plate and the aluminum wire, and a direct current of 100 A/cm$^2$ was passed through in the forward direction for 60 minutes in a state where the pn diode was placed at room temperature. A photoluminescence image of the pn diode in FIG. 4 showed that the stacking faults decreased, as compared to the following Comparative Example 1, in which a thermal treatment was not carried out.

Examples 2 to 4

A pn diode similar to that fabricated in Example 1 was subjected to a thermal treatment at 400° C. (Example 2), 500° C. (Example 3), and 600° C. (Example 4) under the same conditions as those in Example 1 except for the heating temperature. Thereafter, the current passage test was conducted in the same manner as in Example 1. Photoluminescence images of these pn diodes in FIG. 4 showed that the stacking fault apparently decreased in the case of heating at 400° C. and the stacking fault further decreased as the heating temperature was increased.

Comparative Example 1

A pn diode similar to that fabricated in Example 1 was subjected to the current passage test in the same manner as in Example 1 without thermal treatment. A photoluminescence image of the pn diode in FIG. 4 showed that there were a lot of stacking faults having large areas.

Comparative Examples 2 and 3

A pn diode similar to that fabricated in Example 1 was subjected to a thermal treatment under the same conditions as those in Example 1 except that the heating temperature was changed to 200° C. (Comparative Example 2) and 250° C. (Comparative Example 3). Thereafter, the current passage test was conducted in the same manner as in Example 1. Photoluminescence images of these pn diodes showed that there were a lot of stacking faults having large areas which were at the same level as those in Comparative Example 1, in which the thermal treatment was not conducted.

Example 5

For a pn diode similar to that fabricated in Example 1, before the thermal treatment was performed, a silicon carbide single crystal region that was an operation region of the pn diode was irradiated with a laser light or LED light having a light intensity of 1 mW or more and a wavelength of 350 nm to 365 nm. Thereafter, the thermal treatment was conducted under the same conditions as those in Example 1.

The current passage test was conducted for the pn diode after the thermal treatment in the same manner as in Example 1. A photoluminescence image of the pn diode showed that the density of the stacking faults further decreased, as compared to that in Example 1, in which the irradiation with a laser light or LED light was not carried out.

The invention claimed is:

1. A method for producing a bipolar silicon carbide semiconductor device in which an electron and a hole recombine with each other during current passage within a silicon carbide epitaxial film grown from a surface of a silicon carbide single crystal substrate, comprising:
   heating the bipolar silicon carbide semiconductor device at a temperature of 300° C. or higher to cause a reduction of nuclei of a stacking fault and a suppression of an increase of a forward voltage due to current passage, in the final step in the production of the bipolar silicon carbide semiconductor device; and
   applying a light having a wavelength at which an electron-hole pair may be generated to an operation region of the bipolar silicon carbide semiconductor device before the heating.

2. The method according to claim 1, wherein the step of heating the bipolar silicon carbide semiconductor device at a temperature of 300° C. or higher is carried out after a step of forming an electrode.

3. The method according to claim 1, wherein the step of heating the bipolar silicon carbide semiconductor device at a temperature of 300° C. or higher is carried out at least after all ion implantation steps.

4. The method according to claim 1, wherein the step of heating the bipolar silicon carbide semiconductor device at a temperature of 300° C. or higher is carried out at least after a step in which an oxide film at regions including regions where electrodes will be formed, is removed from the surface of the device on which the oxide film is formed in order to protect the device surface, and thereby the epitaxial film in such regions is exposed.

5. The method according to claim 1, wherein the bipolar silicon carbide semiconductor device is a bipolar semiconductor device mounted in a package, the production of the bipolar silicon carbide semiconductor device is completed by the step of heating the bipolar silicon carbide semiconductor device at a temperature of 300° C. or higher, and thereafter the resulting bipolar silicon carbide semiconductor device is mounted in the package.

6. The method according to claim 1, wherein the silicon carbide single crystal substrate is a hexagonal silicon carbide single crystal substrate and the silicon carbide epitaxial film is a hexagonal silicon carbide epitaxial film.

7. The method according to claim 6, wherein both of the hexagonal silicon carbide single crystal substrate and the hexagonal silicon carbide epitaxial film have a four-fold periodicity, a six-fold periodicity or a two-fold periodicity.

8. The method according to claim 1, wherein the silicon carbide single crystal substrate is a silicon carbide single crystal substrate of rhombohedral fifteen-fold periodicity form and the silicon carbide epitaxial film is a silicon carbide epitaxial film of rhombohedral fifteen-fold periodicity form.

9. A method for producing a silicon carbide semiconductor device, comprising:

a step of applying light having a wavelength at which an electron-hole pair may be generated, wherein when the silicon carbide semiconductor device is in the course of production, the light is applied to a region of the silicon carbide semiconductor that will be an operation region of the device, and when the formation of the device is completed, the light is applied to the operation region of the device; and then a step of heating the silicon carbide semiconductor or the silicon carbide semiconductor device at a temperature of 300° C. or higher to cause a reduction of nuclei of a stacking fault and a suppression of an increase of a forward voltage due to current passage.

10. The method according to claim 1, wherein the heating is performed at a temperature of 300° C. to 600° C.

* * * * *

UNITED STATES PATENT AND TRADEMARK OFFICE
CERTIFICATE OF CORRECTION

PATENT NO. : 8,367,510 B2  
APPLICATION NO. : 12/067028  
DATED : February 5, 2013  
INVENTOR(S) : Miyanagi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1364 days.

Signed and Sealed this

First Day of September, 2015

Michelle K. Lee
*Director of the United States Patent and Trademark Office*